US011843915B2

(12) United States Patent
Han et al.

(10) Patent No.: US 11,843,915 B2
(45) Date of Patent: Dec. 12, 2023

(54) ACTIVE PIEZOELECTRIC SHEET WITH PIEZOELECTRIC MICROSTRUCTURES

(71) Applicant: Massachusetts Institute of Technology, Cambridge, MA (US)

(72) Inventors: Jinchi Han, Cambridge, MA (US); Jeffrey H. Lang, Sudbury, MA (US); Vladimir Bulovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/508,133

(22) Filed: Oct. 22, 2021

(65) Prior Publication Data

US 2023/0054412 A1  Feb. 23, 2023

Related U.S. Application Data

(60) Provisional application No. 63/235,399, filed on Aug. 20, 2021.

(51) Int. Cl.
    *H04R 17/02*   (2006.01)
    *H04R 1/40*    (2006.01)
    *H04R 7/12*    (2006.01)
    *H04R 3/00*    (2006.01)
    (Continued)

(52) U.S. Cl.
    CPC .......... *H04R 17/025* (2013.01); *H04R 1/403* (2013.01); *H04R 1/406* (2013.01); *H04R 3/005* (2013.01); *H04R 7/127* (2013.01); *H10N 30/084* (2023.02); *H10N 30/883* (2023.02); *H04R 2400/01* (2013.01)

(58) Field of Classification Search
    CPC ...... H04R 17/025; H04R 1/403; H04R 1/406; H04R 3/005; H04R 7/127; H04R 2400/01; H01L 41/0533; H01L 41/333
    USPC .................................... 381/91, 92, 111, 122
    See application file for complete search history.

(56) References Cited

U.S. PATENT DOCUMENTS

| 4,122,725 A | 10/1978 | Thompson |
| 2004/0189425 A1 | 9/2004 | Iwashita et al. |

(Continued)

FOREIGN PATENT DOCUMENTS

| CN | 105300572 | 2/2016 |
| CN | 206792410 U | 12/2017 |

(Continued)

OTHER PUBLICATIONS

J. Han, J. Lang, V. Bulovic, Acoustically-active Surface for Automobile Interiors Based on Piezoelectric Dome Arrays, MIT Annual Research Report 2020, MEMs, Field-Emitter, Thermal, and Fluidic Devices, 1 page, p. 105.

(Continued)

*Primary Examiner* — William A Jerez Lora
(74) *Attorney, Agent, or Firm* — DALY, CROWLEY, MOFFORD & DURKEE, LLP (57) ABSTRACT

An active acoustic system includes a thin-film sheet having an array of piezoelectric microstructures embossed in the film. Each piezoelectric microstructure may act as a speaker and/or a microphone. A control circuit is configured to individually address the piezoelectric microstructures to provide a separate voltage signal to, or receive a separate voltage signal from, each piezoelectric microstructure.

25 Claims, 10 Drawing Sheets

(51) Int. Cl.
  *H10N 30/084* (2023.01)
  *H10N 30/88* (2023.01)

(56) References Cited

U.S. PATENT DOCUMENTS

| | | | |
|---|---|---|---|
| 2014/0186062 A1* | 7/2014 | Mitsui | G03G 15/0858 |
| | | | 399/27 |
| 2015/0078136 A1 | 3/2015 | Sun et al. | |
| 2017/0125660 A1* | 5/2017 | Stephanou | G06F 1/1637 |
| 2017/0336869 A1* | 11/2017 | Khoshkava | G06F 1/1643 |
| 2018/0309043 A1 | 10/2018 | Kobrin et al. | |
| 2021/0377671 A1* | 12/2021 | Grinnip, III | H04R 19/02 |

FOREIGN PATENT DOCUMENTS

| | | |
|---|---|---|
| CN | 112229545 | 1/2021 |
| CN | 112229546 | 1/2021 |
| CN | 112692438 | 4/2021 |
| KR | 1020200073450 | 6/2020 |
| WO | WO 2016/007250 A1 | 1/2016 |
| WO | WO 2019/033466 A1 | 2/2019 |

OTHER PUBLICATIONS

PCT International Search Report and Written Opinion dated Oct. 5, 2022 for International PCT Application No. PCT/US22/35909; 9 pages.

* cited by examiner

ACTIVE PIEZOELECTRIC SHEET WITH PIEZOELECTRIC MICROSTRUCTURES

RELATED APPLICATIONS

This application claims priority to U.S. Provisional Application No. 63/235,399 (filed Aug. 20, 2021), which is incorporated here by reference in its entirety.

FIELD

This disclosure relates to acoustic surfaces and, more particularly, to acoustic surfaces with an array of active piezoelectric elements.

BACKGROUND

The increasing use and popularity of the Internet-Of-Things has created fast-growing demands and more stringent requirements for acoustic transducers. Their applications are no longer constrained to simple sound generation and sensing or distance measurement, but have begun to be used in applications such as industrial automation, artificial intelligence, robotics, smart homes, intelligent transportation, consumer electronics and biomedical engineering, where sound may act as an important medium for sensing and communication. For example, in conventional scenarios, growing interests in free-field active noise cancelling and personal entertainment create demand for arrays of speakers and microphones coordinated with adaptive algorithms to realize beam forming and directional sound generation, which is beyond the reach of commercial loudspeakers or stereo audio systems at present.

SUMMARY

Acoustically active thin films with transducer arrays provide benefits and functions that cannot be achieved by commercial loudspeakers. For example, active acoustic surfaces implemented on the walls in a room can create a surround-sound audio system in a cost-effective way. In addition, the large number of transducers on the acoustic surfaces can be grouped into blocks of loudspeakers through external electrical connections. When their dimensions are comparable or larger than the wavelength respective to the pitch of music (or the frequency of the audio that they are producing), directionality of sound generation could enable personal entertainment without disturbing others. The same concept extends to other public scenarios such as offices, vehicles and aircrafts, etc.

Microphones and loudspeakers formed on a wall or other surfaces can also provide device-free communication among family members in different rooms and convenient voice control of smart appliances and robots virtually anywhere in a house. Acoustic surfaces mounted on the door and exterior of the house may be used to contribute to the home security system. Visitors can be recognized as friends or strangers by comparing their voice patterns with the library in the home security system. The location of a noise can be identified using beamforming techniques. Transducer arrays on the acoustic surfaces can be used to detect moving objects.

An acoustic film can also be used for active noise cancellation, acoustic detection of a hazard or malfunction in machinery, localized speaker systems, or other office or industrial applications.

Therefore, multifunctional acoustic films that integrate arrays of diverse acoustic transducers may cater to the demands in these scenarios. When these films are designed to be wide-area, transparent, paper-thin, flexible, and robust, they can be mounted on the surfaces of various objects in an inconspicuous way to render them acoustically active.

In an embodiment, a system to address some or all the scenarios and problems described above may include a sheet comprising an array of piezoelectric microstructures, where each piezoelectric microstructure has at least two terminals coupled to the control circuit. A control circuit having output terminals is coupled to at least one terminal of each piezoelectric microstructure. The circuit is configured to address the piezoelectric microstructures, either individually or in blocks, to provide desired control voltage signals to the microstructures across the array of piezoelectric microstructures.

In another embodiment, an active acoustic surface comprises a sheet having an array of piezoelectric microstructures. Each piezoelectric microstructure has at least one electrical terminal for coupling to a driver circuit. A protective layer is disposed on one side of the sheet. The protective layer has an array of through holes. Each through hole in the array is positioned over a piezoelectric microstructure of the array of piezoelectric microstructures.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
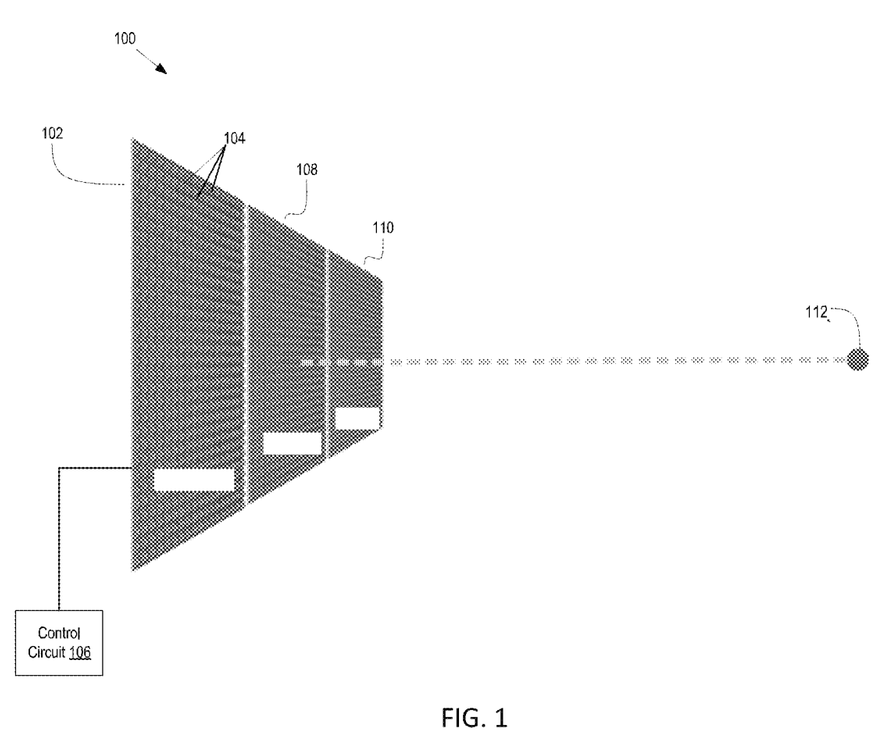
FIG. 1 is a diagram of an acoustic system having multiple acoustically active sheets.

FIG. 1 is an acoustic system 100 including one or more acoustic sheets 102. The acoustic sheets 102 each have an array of active piezoelectric microstructures 104 that can be used to generate sound waves (like a speaker) or receive sound waves (like a microphone). These piezoelectric structures may be raised surfaces in the sheet material, as will be discussed below.

In this example, the system 100 includes three acoustic sheets 102, 108, and 110 that are coupled to a control circuit 106. The control circuit can send electrical signals to and receive electrical signals from the sheets. In embodiments, the control circuit 106 can address the individual piezoelectric microstructures 104 within each sheet and provide an electrical signal to each one and/or can address blocks of piezoelectric microstructures 104 and provide an electrical signal the piezoelectric microstructures within the blocks.

In embodiments, the sheet 102 includes at least one electrical terminal coupled to an electrical output terminal of the control circuit 106. The control circuit can drive a voltage signal (e.g. an AC voltage signal) from the terminal to the sheet. The voltage signal causes one or more of the piezoelectric structures 104 to flex. In the case of an AC voltage signal, the piezoelectric structures will vibrate, which produces an acoustic wave in the surrounding air. Depending on frequency of drive voltage, the resulting acoustic wave may be infrasonic, ultrasonic, or within the range of human hearing.

Additionally or alternatively, the sheet may be coupled to an electrical input terminal of the control circuit 106. In this case, acoustic waves in the surrounding air may cause the piezoelectric structures 104 to vibrate. The vibration causes the piezoelectric structures to generate voltage signals, which can be detected by the control circuit 106. By translating the acoustic waves to voltage signals, the system 100 may act as a microphone that can detect acoustic signals in the external environment from an acoustic source (e.g. source 112).

In embodiments, the system 100 may include amplification and filtering circuitry (not shown) coupled between the sheets 102, 108, and 110 and the control circuit 106 to amplify, filter, and shape the electrical signals between the sheets and the control circuit 106. The system 100 may also include multiplexing circuits coupled to allow the control circuit 106 to address individual or blocks of piezoelectric microstructures within the sheet.

As shown in FIG. 1, the system may include a plurality of sheets 102, 108, 110. Like sheet 102, sheets 108 and 110 may also be electrically coupled to control circuit 106 (or another control circuit). Each sheet may act as an independent acoustic source or microphone. This can be useful for acoustic beamforming, including generating acoustic sound in a specific location when the sheets are used as speakers, or locating the position of an acoustic source when the sheets are used as microphones. For example, each sheet may be used as an individual speaker or microphone in a system that uses beamforming to direct acoustic sound in a particular location or to detect the location of a source of acoustic sound. Because the piezoelectric microstructures are individually addressable (as discussed below), the individual piezoelectric structures (or blocks of piezoelectric structures within the sheet) can be used as individual speakers or microphones in a beamforming array that can direct acoustic sound to a location or detect the location of a source of acoustic sound.

The sheets may also be used for echolocation by using the sheets as speakers to generate an acoustic sound (which may be ultra-infra-sonic), then using the sheets as microphones to capture the echo of the acoustic sound as it bounces back to the sheets from an object in the environment.

In embodiments, some or all the piezoelectric microstructures 104 may be individually coupled to and individually addressable by the control circuit 106. This may allow the control circuit 106 to activate the piezoelectric microstructures by driving voltage signals to, or receiving voltage signals from, the piezoelectric microstructures. In embodiments, the piezoelectric microstructures 104 may be coupled to a grid to conductive traces and/or multiplexor circuit that allows the control circuit 106 to address and send individual signals to each piezoelectric microstructure 104.

Figure 2A:
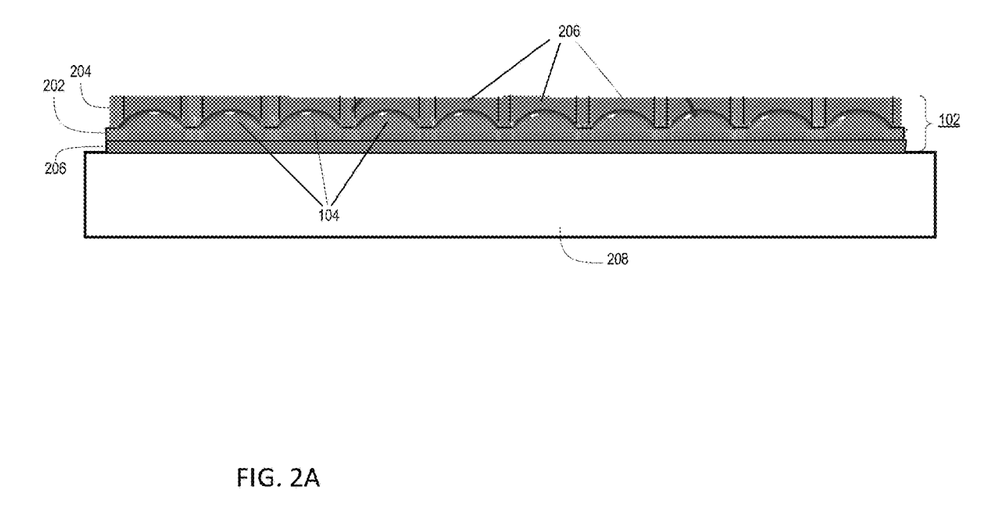
FIG. 2A is a cross section of an acoustically active sheet.

Referring to FIG. 2A, a cross section of sheet 102 shows a substrate 202 (e.g. a piezoelectric substrate) that forms a base layer of the sheet 102. The substrate 202 may be formed from a flexible, plastic material such as a polymer or a rigid ceramic, glass, or single-crystal material. In one embodiment, the substrate 202 may comprise or be formed from piezoelectric polymers such as polyvinylidene fluoride ("PVDF") or PVDF copolymers. In another embodiment, the substrate 202 may comprise piezoelectric ceramics or single-crystal materials such as lead zirconate titanate, zinc oxide, barium titanate, lithium niobate, lead titanate. The substrate 202 may also include single-crystal and/or ceramic piezoelectric nanoparticles embedded in the polymers, which may provide the substrate 202 with additional flexibility.

A plurality of piezoelectric microstructures is formed in the sheet 102. These piezoelectric structures 104 are small protrusions of the sheet 102 that act as sensing/actuating elements. For example, when an AC voltage is applied across one of the piezoelectric structures 104, the piezoelectric microstructure will expand and contract periodically in response to the voltage. In this example, the piezoelectric microstructures 104 are semi-spherical in shape. However, other shapes may also be used.

The sheet 102 may also include a protective layer 204 positioned on one side of the sheet 102. In embodiments, the protective layer 204 includes through-holes 207 positioned above each piezoelectric structure 104. The protective layer 204 protects the piezoelectric microstructures 104 by providing a barrier that prevents the piezoelectric structures 104 from being physically damaged. Thus, in embodiments, the thickness of the protective layer 204 may be greater than the height of the piezoelectric microstructures 104.

The through-holes 207 in the protective layer 204 allow the piezoelectric structures 104 to access air in the environment so that they can detect or generate sound waves in the air. In embodiments, the protective layer may include wiring that can be coupled to some or all the piezoelectric structures to provide electrical connections to the control circuit 106. The protective layer may be a perforated, flexible film deposited or laminated on the surface of the substrate. In embodiments, the protective layer is formed from a plastic film such as polyester, polyethylene, polypropylene, polycarbonate, polyvinyl chloride, polyvinylidene chloride, nylon.

Sheet 102 may also include an encapsulation layer 206 positioned on a side of the substrate layer 202. The encapsulation layer 206 may also be formed from a plastic film. In embodiments, the encapsulation layer 206 may be perforated with an array of holes/cavities to allow the piezoelectric microstructures 104 to freely vibrate. In this example, the perforations may be aligned with the piezoelectric microstructures 104 so that the gaps formed by the perforations are adjacent to the piezoelectric microstructures 104.

The sheet 102 may be placed and mounted on the surface of an object 208. In embodiments, the sheet 102 may include an adhesive backing layer that will adhere the sheet 102 to the mounting object 208. In other embodiments, a separate adhesive can be used, or the sheet 102 can be mounted to the mounting object 208 by fasteners. The mounting object can be any object with a surface that can accept the sheet 102. Because the sheet 102 may be flexible, it can be adhered to flat surfaces, like the surface of a wall, curved surfaces, like the outer surface of a coffee mug, or any other surface that can accommodate the sheet 102. If an adhesive backing is used, it may be preferable if the surface of the mounting object 208 is smooth.

In embodiments, the total thickness of sheet 102 may be 1 mm or less. In other embodiments, the thickness of substrate 202 may be 1 mm or less. In some embodiments, the thickness of substrate 202 may be 25 microns or less.

Figure 2B:
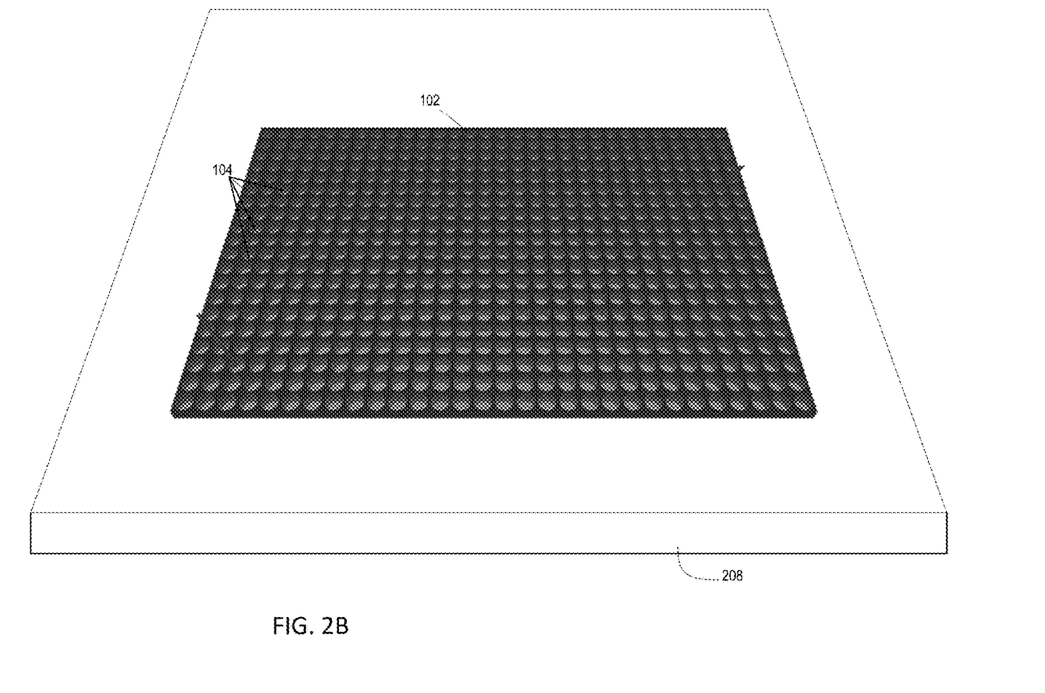
FIG. 2B is a raised view of an acoustically active sheet mounted on a mounting object.

FIG. 2B is a raised view of the sheet 102 and mounting object 208. As shown, the sheet has an array of piezoelectric microstructures 104 formed on its surface. The microstructures may be arranged in rows and columns, as shown, or in any regular or irregular pattern along the surface of sheet 102. In embodiments, the area of the piezoelectric structures may be 25% or more of the total area of the sheet 102. The area mass density of the sheet 102 may be lower than 0.06 grams/cm$^2$. The total area of the sheet 102 can be many square meters. In embodiments, the radius of the piezoelectric microstructures can range from less than about 100 microns to great than about 3 cm. The mass density of the sheet 102 can vary from less than about 0.0001 g/cm$^2$ to more than about 1 g/cm$^2$. The area of the sheet 102 can vary from less than about 100 square microns to more than many square meters.

Figure 2C:
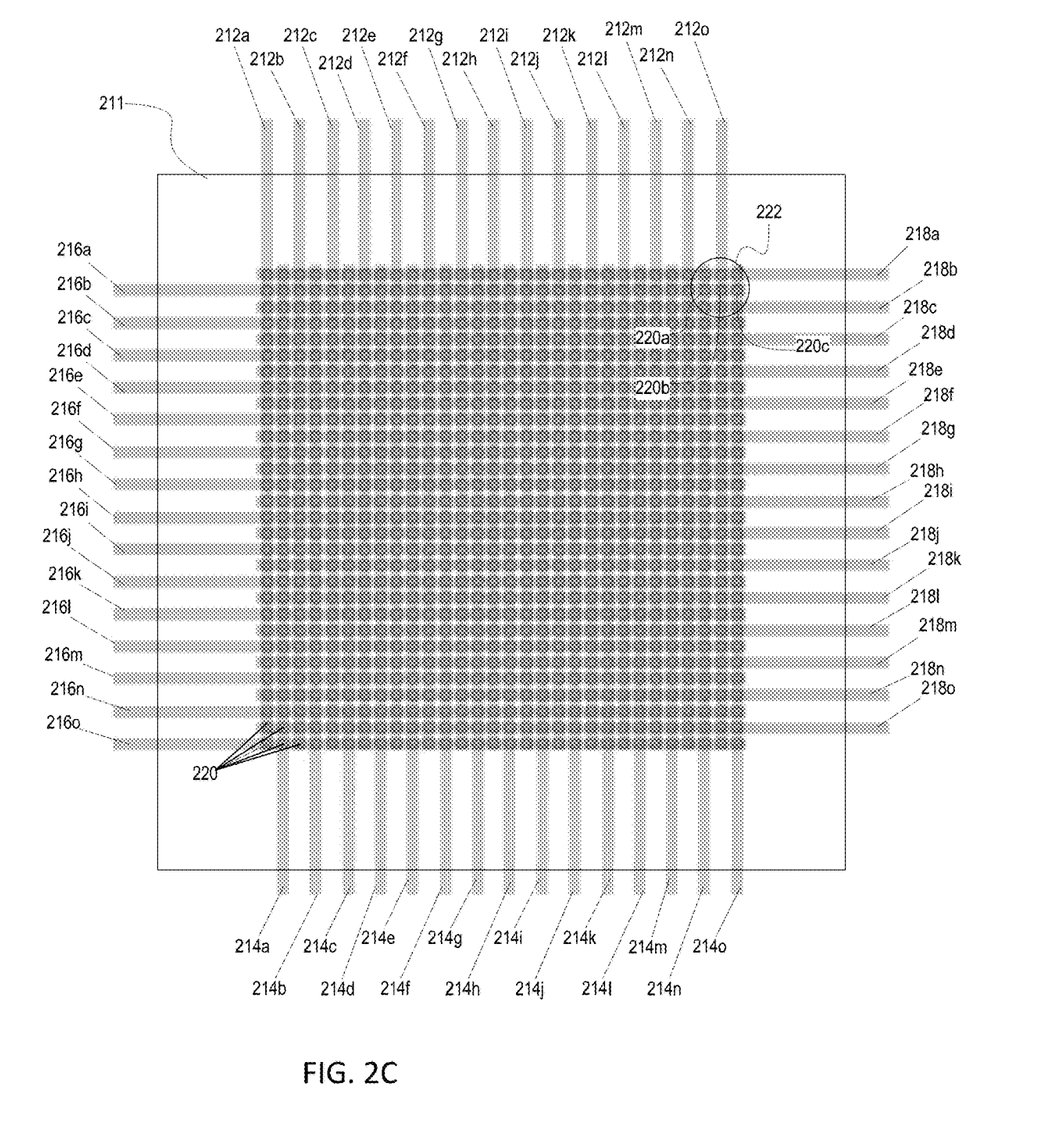
FIG. 2C is a top view of an acoustically active sheet including electrical traces.

Referring to FIG. 2C, an acoustically active sheet 210 may be the same as or similar to sheet 102 and may include an array of piezoelectric microstructures 220 which may be the same as or similar to piezoelectric microstructures 104. In embodiments, sheet 210 may also include electrical traces 212a-o, 214a-o, 216a-o, 218a-o that can provide electrical connections to the individual piezoelectric microstructures 220. The electrical traces may be formed from an electrically conductive material such as copper or aluminum, for example, that is deposited on the surface of the sheet 210.

In this example, the electrical traces 212a-o, 214a-o, 216a-o, 218a-o may be arranged in a grid pattern where electrical traces 216a-o and 218a-o are arranged horizontally and electrical traces 212a-o and 214a-o are arranged vertically. In this grid pattern, each piezoelectric microstructure is overlayed by one vertical trace and one horizontal trace. For example, piezoelectric microstructure 220a is overlayed by vertical trace 216a and horizontal trace 214n. Thus, piezoelectric microstructure 220a can be activated by driving a voltage signal (e.g. an AC signal) onto traces 216a and 214n. Likewise, for example when used as a microphone, a voltage signal produced by piezoelectric microstructure 220a can be detected by measuring the voltage across traces 216a and 214n.

As shown in FIG. 2C, horizontal traces 216a-o extend beyond the edge of the array of piezoelectric microstructures 220 to the left and horizontal traces 218a-o extend beyond the end of the array of piezoelectric microstructures to the right. These extensions act as terminals that can be connected to external circuitry such as a multiplexor circuit or a processor (e.g. control circuit 106). Likewise, vertical traces 212a-o extend beyond the array to the top and vertical traces 214a-o extend beyond the array to the bottom. Like the horizontal traces, the extensions of the vertical traces can also be connected to external circuitry such as a multiplexor or processor. Once connected, the external circuitry can be used to drive electrical signals onto the traces to cause the piezoelectric microstructures to produce sound, or to receive electrical signals from the traces in response to external stimulus deforming or vibrating the piezoelectrical microstructures. These traces may allow the piezoelectric microstructures to be individually addressed by the external circuitry.

Additionally or alternatively, the external circuitry can drive signals onto or receive signals from multiple traces at the same time to activate multiple piezoelectric structures. For example, a block (i.e. a sub-array) of the array of piezoelectric microstructures can be activated at once when the remainder of the array remains inactive. Similarly, a row or column can be active while the remainder of the array remains inactive. In general, a group of arbitrarily chosen piezoelectric microstructures from the array can be activated at the same time by the control circuit 106 by driving signals to (or receiving signals from) the traces coupled to the chosen piezoelectric microstructures. One skilled in the art will recognize that the terminal extensions of the traces 212a-o, 214a-o, 216a-o, 218a-o can be constructed in different physical arrangements (for example the terminal extensions could all be on one side of the array of piezoelectric microstructures) as long as they can be coupled to external circuitry such as control circuit 106.

Figure 2D:
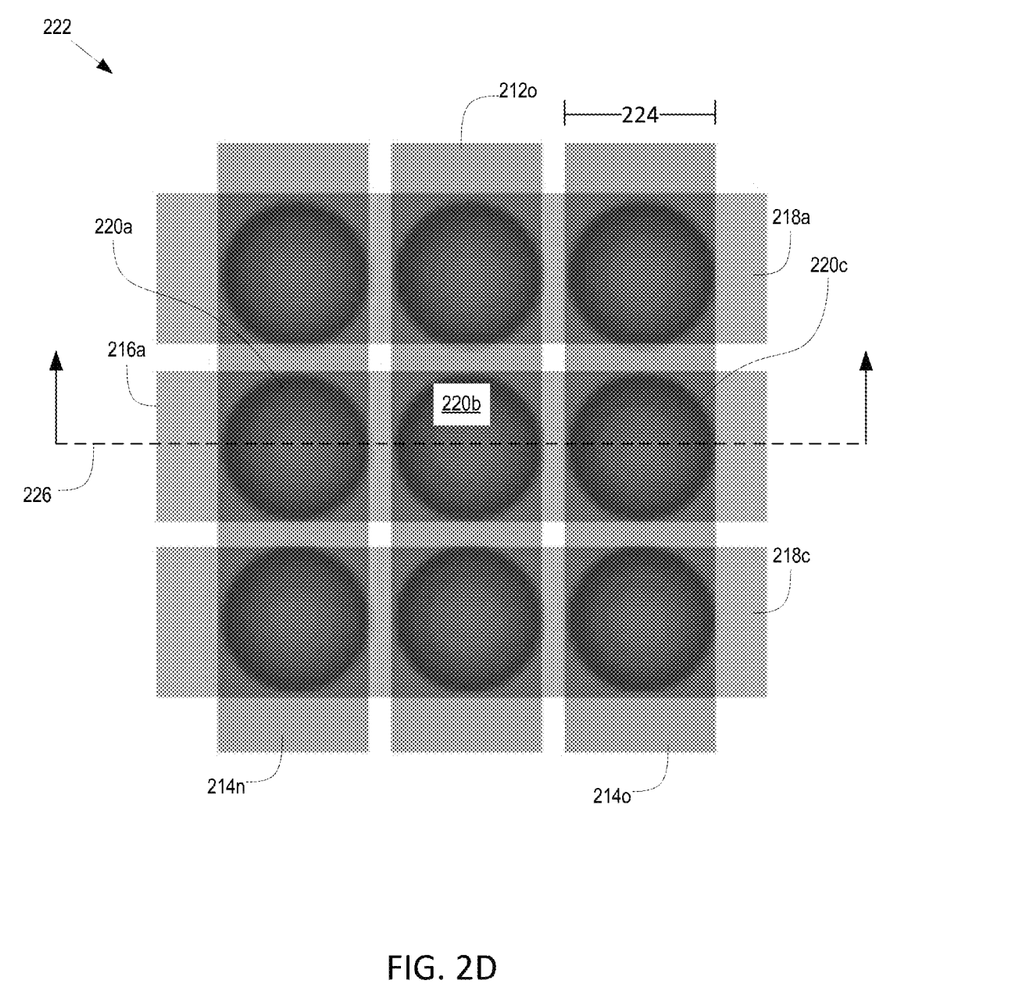
FIG. 2D is a magnified view of a portion of the acoustically active sheet of FIG. 2C.

FIG. 2D is a magnified view of portion 222 of the sheet 210 shown in FIG. 2C. As shown in this example, the traces 212a-o, 214a-o, 216a-o, 218a-o may have a width (e.g. width 224) that is about the same as the diameter of the piezoelectric microstructures. In other embodiments, the width 224 of the traces may be less than or greater than the diameter of the microstructures.

Figure 2E:
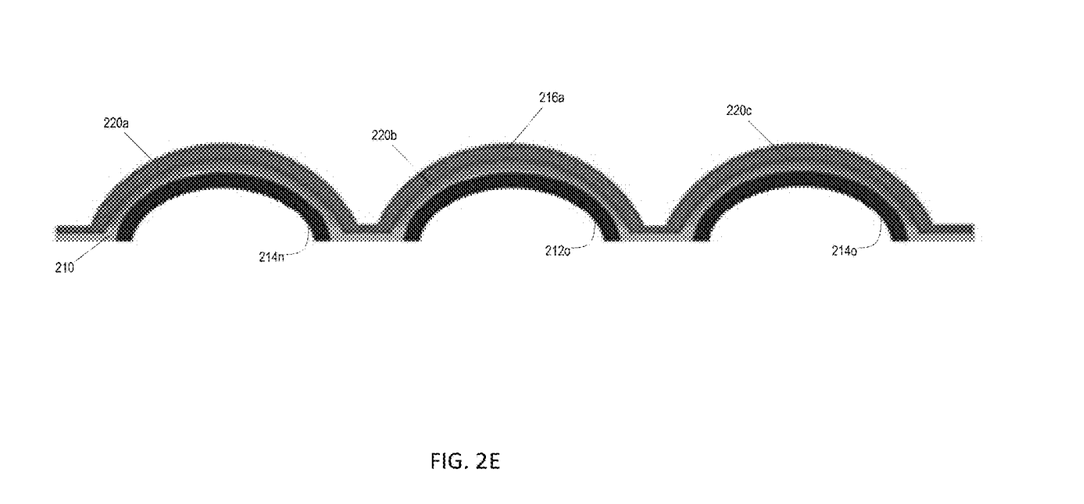
FIG. 2E is a cross sectional view of the portion of the acoustically active sheet of FIG. 2D.

FIG. 2E is a cross section of sheet 210 (as seen from line 225 in FIG. 2D). The sheet 210 is sandwiched between layers of the conductive traces. As shown, some of the traces may be positioned on the top surface of the sheet 210 and some may be positioned on the bottom surface of the sheet 210. Specifically, in this example, the horizontal trace 216a is positioned on the top surface of the sheet 210 and extends left-to-right across the page. The conductive traces 214n, 212o, and 214o are positioned on the bottom surface of the sheet 210 and extend into and out of the page. The horizontal trace 216a makes electrical contact with the top surfaces of piezoelectric microstructures 220a, 220b, and 220c. Traces 214n, 212o, and 214o each make electrical contact with the bottom surface of piezoelectric microstructures 220a, 220b, and 220c respectively.

Using these traces, the control circuit 106 can address and activate individual piezoelectric microstructures. Applying an AC voltage from trace 216a to trace 214n will cause an AC voltage signal across piezoelectric microstructure 220a, for example. Acoustic sound detected by piezoelectric microstructure 220b can be captured by sampling the voltage signal across traces 216a and 212o that is produced by piezoelectric microstructure 220b. Any piezoelectric microstructure (or group of piezoelectric microstructure) in the array can be addressed and activated by applying a voltage signal to or reading a voltage signal from the appropriate conductive traces on the sheet 210.

Figure 3:
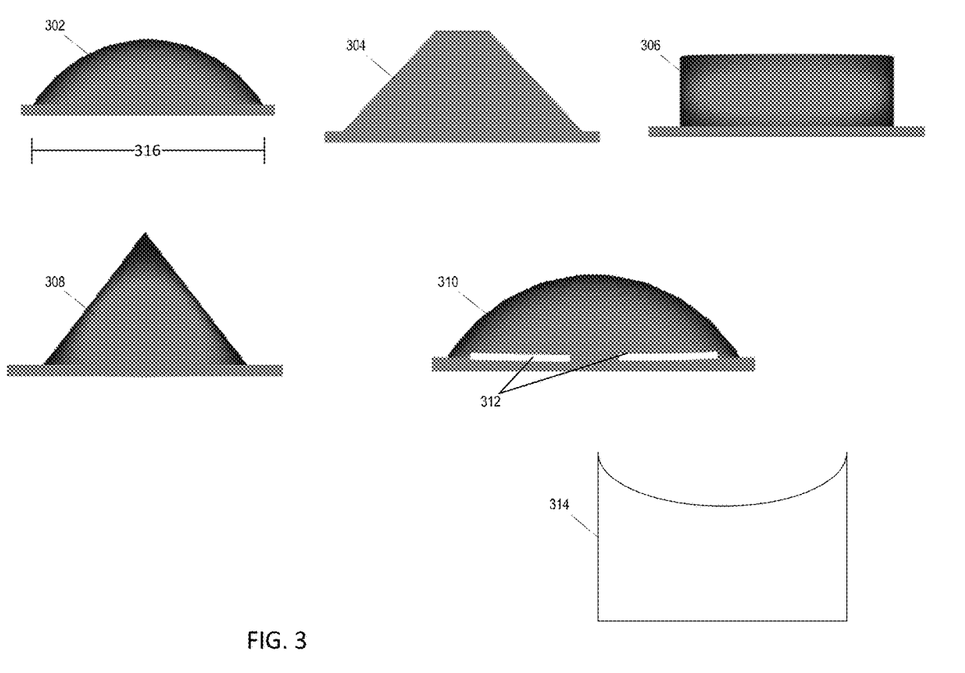
FIG. 3 is a series of diagrams illustrating shapes of piezoelectric microstructure domes.

FIG. 3 provides examples of piezoelectric microstructures having different shapes that can be used when forming the piezoelectric microstructures 104 on sheet 102 (or 210). Each of these shapes may produce acoustic sound with different timbre. Also, the different shapes may change the natural resonant frequency of the piezoelectric microstructure which may result in better acoustic performance of the microstructure at different frequencies or frequency ranges. The possible shapes of the piezoelectric microstructures include, but are not limited to, a semispherical dome 302, a pyramid or frustrum 304, a pillar 306, and a cone 308. A concave shape 314 having a concave surface may also be used. Some or all of the shapes may include holes 312 in the piezoelectric microstructure, as shown in dome 310. These holes may reduce the spring constant of the structure, effectively allowing the piezoelectric microstructure to deform and bend more easily, which can result in larger vibration in response to a voltage signal applied to the piezoelectric microstructure or to sonic vibrations in the air. The holes 312 may be located at the base of the microstructure, as shown in FIG. 3, or at any other location on or near the microstructure that can reduce the structural stiffness.

The diameter 316 of the microstructures may be 1 mm or less. In embodiments, the diameter of the microstructures may be less than about 700 micrometers to more than a few centimeters.

Fabrication

Figure 4:
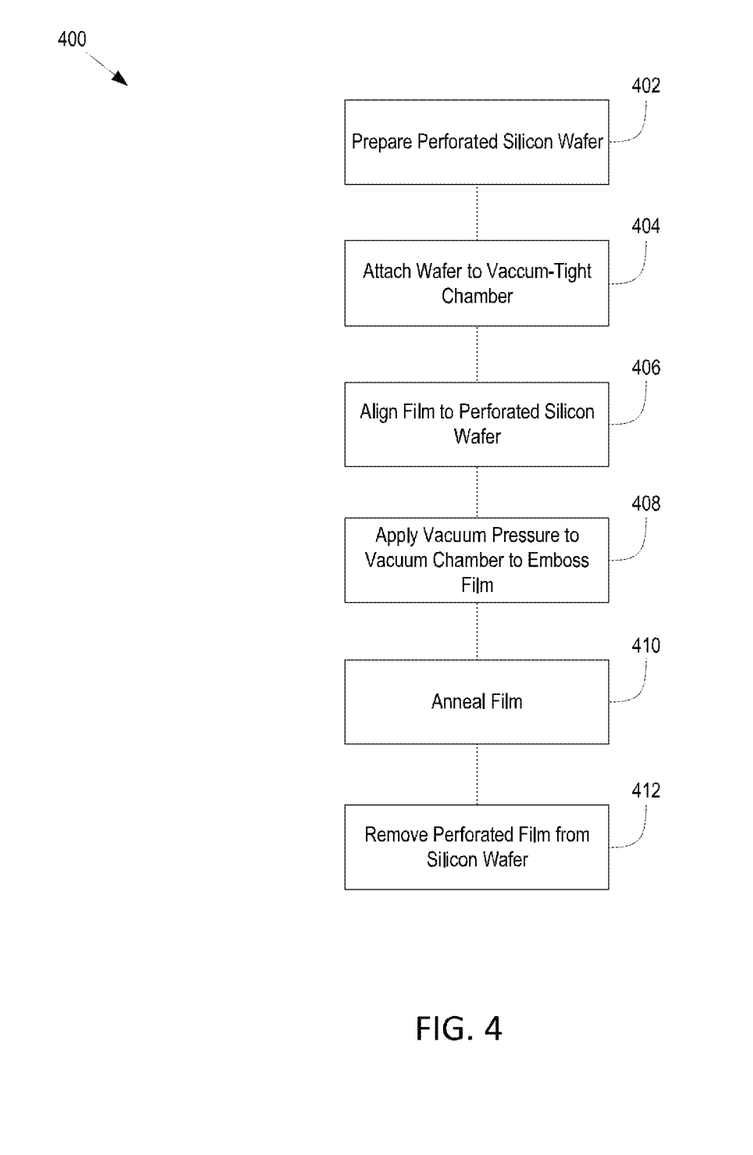
FIG. 4 is a flow diagram of a process for fabricating an acoustically active sheet.
Figure 5A:
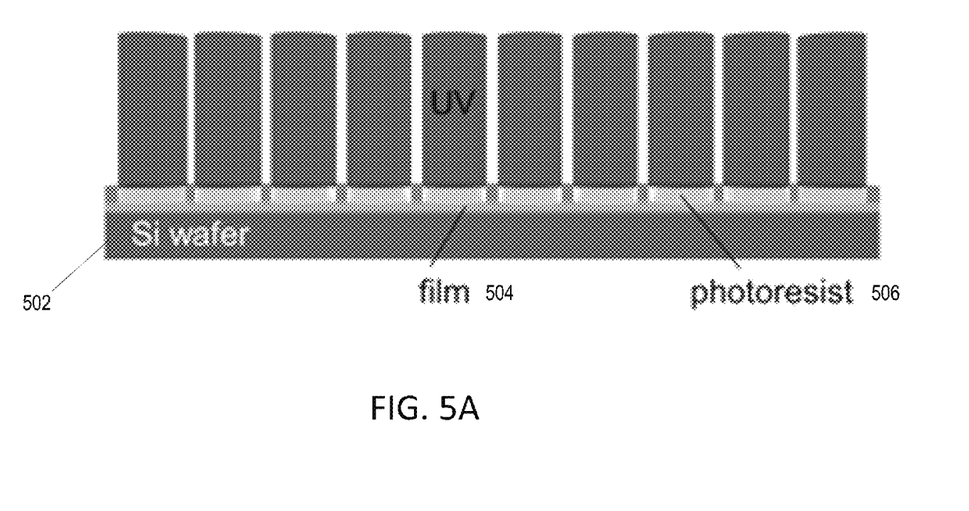
FIG. 5A is a cross section of a silicon wafer that is being fabricated into a mold for use in producing an acoustically active sheet.
Figure 5B:
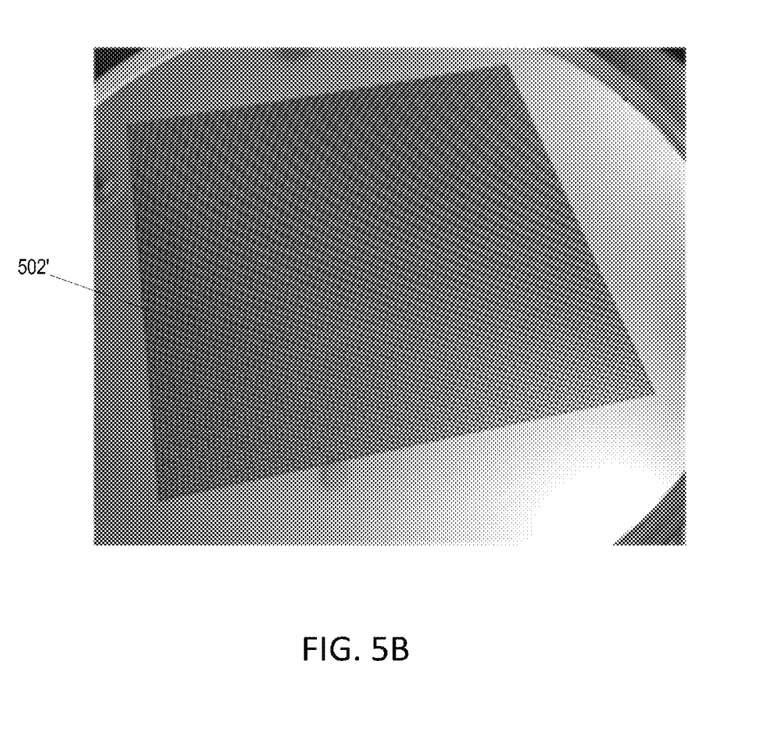
FIG. 5B is a raised view of a mold used in fabricating an acoustically active sheet.

Referring to FIGS. 4, 5A, and 5B, an example of a process 400 for fabricating an active acoustic sheet having piezoelectric microstructures is illustrated as a flowchart. The process 400 may be based on a controlled vacuum used to emboss the sheet with raised microstructures. In box 402, a perforated silicon wafer, which will be used as a mold for the piezoelectric microstructures, is prepared by microfabrication. An example of the perforated silicon wafer 502 is shown in FIG. 5A. A hard film may be used for mask film layer 504 (for example, a 100-nm-thick aluminum (Al) film), which may be deposited onto a silicon wafer 502 by a thermal evaporation process. A photoresist layer 506 (for example, a layer of AZ 4620 photoresist material) may then be disposed on top of the mask film layer 504. The photoresist layer may then be baked before exposure.

A through hole array pattern that defines the locations, shape and size of the piezoelectric microstructures may then be projected onto the photoresist layer 506. After exposure, the photoresist layer 506 is developed and, optionally, baked again. With the photoresist layer 506 processed, the mask film layer 504 is then etched to pattern the hard mask layer. The silicon wafer 502 may then be mounted on a backing wafer (not shown). The photoresist layer 506 may be removed or maintained as an additional mask layer.

Once mounted, with the mask film layer 504 and photoresist layer 506 in place, the silicon wafer 502 is etched (for example, by using a deep reactive ion etching process) to form an array of through-holes in the silicon wafer 502. The photoresist layer 506 is then stripped away if not removed before etching. The result is a silicon wafer mold 502' that is perforated with through holes, as shown in FIG. 5B. This process allows the size and shape of the through-holes to be precisely defined. In embodiments, the radius of the through-holes may be about 350 micrometers.

In embodiments, to strengthen the mold, several perforated silicon wafer molds 502' with through-hole arrays may be prepared, aligned, and stacked together for use. In other embodiments, perforated, thick metal plates could be used as the mold for the embossing process. Alternatively, a porous, rigid, thick plate (for example, glass, acrylic, etc.) can also be used as structural backing plate to minimize or eliminate bending of the silicon wafer mold 502' during the embossing process.

Figure 6:
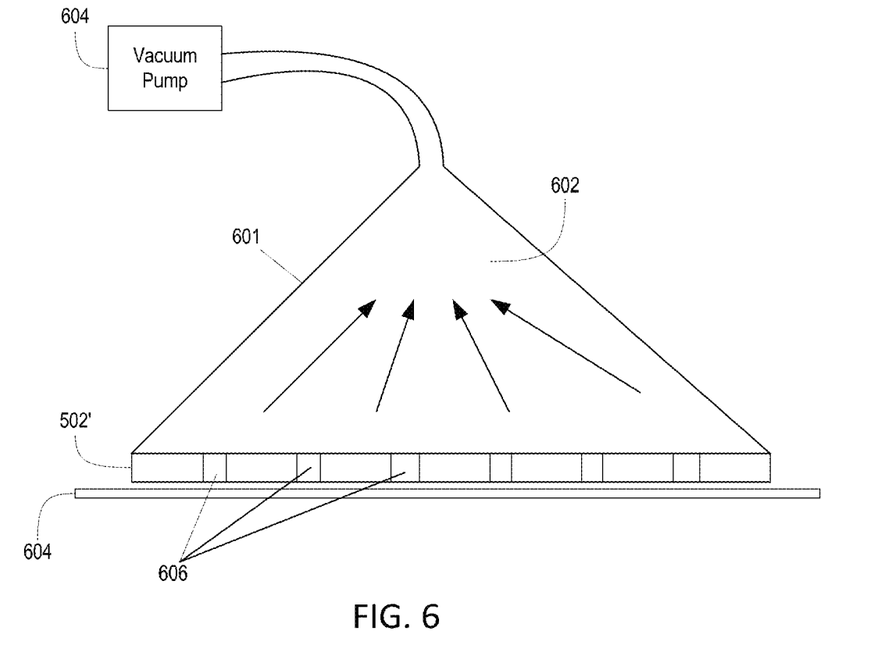
FIG. 6 is a cross section of the mold of FIG. 5A coupled to a vacuum chamber.

Referring now to FIG. 4 and FIG. 6, once the silicon wafer mold 502' is prepared, it is adhered (box 404) to a vacuum-tight chamber (for example, a glass funnel 601 as shown in the example if FIG. 6). The vacuum-tight chamber 602 may be connected to a vacuum pump 605 that can precisely control vacuum pressure and timing in the chamber 602 and, thus, control the vacuum pressure through the perforations 606 of the silicon wafer mold 502'.

To emboss the piezoelectric film and create the piezoelectric microstructures, the piezoelectric film 604 is adhered to the side of the perforated silicon wafer mold 502' that is open to air (box 406). The vacuum pressure in chamber 602 embosses the film 604 (box 408) at the locations of the perforations 606 in the silicon wafer mold 502', thus creating domes in the film 604.

Figure 7:
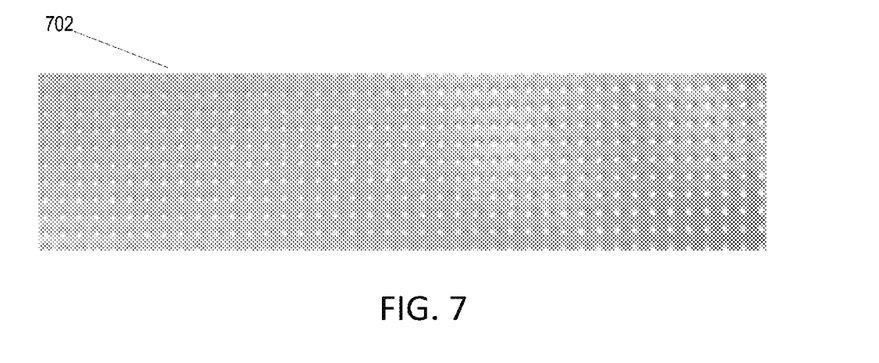
FIG. 7 is an illustration of an acoustically active sheet formed from the process of FIG. 4.

In embodiments, the film 604 is then annealed (box 410) using a repetitive annealing process to relieve the stress and help maintain the dome profile of the piezoelectric microstructures after the vacuum pressure is removed. For example, the silicon wafer mold 502' with the embossed film 604 adhered to it is heated by a hot plate to anneal the film. Then the silicon wafer mold 502' and film 604 may be cooled down to room temperature while the vacuum is kept on. Such annealing and cooling treatment can be repeated one or more times to complete the embossing process. The embossed piezoelectric film 604 is then removed from the silicon wafer mold 502' (box 412). This process may result in an embossed piezoelectric film 702 having an array of piezoelectric microstructures, as shown in FIG. 7.

The heights of the embossed piezoelectric microstructures depend on the vacuum pressure during embossing. A higher vacuum level can create larger deformation and taller domes. In embodiments, the vacuum pressure may be adjusted to create piezoelectric microstructures with a radius 350 micrometers and a height of about 20 micrometers.

A reduced thickness of the 604 can result in higher sensitivity for sound generation. As a result, a piezoelectric film 604 with a thickness of a few microns may be preferable. To protect the domes from damage caused by mechanical abrasion and/or impact from day-to-day human handling, a perforated protective layer (e.g. layer 204 in FIG. 2) is fabricated and laminated on the film 604, as discussed above. The thickness of the protective layer 204 may be larger than the dome height to provide protection from mechanical abrasion and/or impact.

The through-holes on the protective layer 204 may be cut, for example, by a $CO_2$ laser cutter in rastering mode. The through-holes may then be aligned with the piezoelectric microstructures 104 so that these active microstructures can vibrate without being impeded by the protective layer.

As discussed above, an encapsulation layer 206, which, in embodiments, may be identical to the protection layer 204, may be adhered to the other side of the piezoelectric film. The through-holes in the encapsulation layer 204 that align with the piezoelectric microstructures may create isolated back cavities. The volume of these back cavities may be large enough so that the volume change of the cavities caused by the dome vibration is negligible. In this way, the pressure in the cavity can be maintained close to atmosphere pressure so that it does not impede vibration of the domes.

One skilled in the art will recognize that the fabrication process described above and shown in FIGS. 4-7 is an example process. Other processes may be employed to fabricate sheets with an array of one or more piezoelectric microstructures.

Various embodiments of the concepts, systems, devices, structures, and techniques sought to be protected are described above with reference to the related drawings. Alternative embodiments can be devised without departing from the scope of the concepts, systems, devices, structures, and techniques described. It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture or an article, that comprises a list of elements is not necessarily limited to only those elements but can include other elements not expressly listed or inherent to such apparatus, method, composition, mixture, or article.

Additionally, the term "exemplary" is means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e. one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether or not explicitly described.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

The invention claimed is:

1. An active acoustic system comprising:
   a piezoelectric substrate comprising an array of piezoelectric microstructures, each piezoelectric microstructure having at least two terminals; and
   a control circuit having output terminals coupled to at least one terminal of each piezoelectric microstructure, the control circuit configured to address one or more piezoelectric microstructures in the array of piezoelectric microstructure to provide one or more voltage signals to the piezoelectric microstructures to control the piezoelectric microstructures in the array of piezoelectric microstructures.

2. The active acoustic system of claim 1 further comprising a protective layer disposed on one side of the substrate, the protective layer comprising an array of through-holes, each through-hole in the array of through-holes positioned over a piezoelectric microstructure of the array of piezoelectric microstructures.

3. The active acoustic system of claim 1 wherein the substrate comprises protrusions that form the piezoelectric microstructures.

4. The active acoustic system of claim 3 wherein at least one of the protrusions is dome-shaped.

5. The active acoustic system of claim 3 wherein at least one of the protrusions has a concave surface.

6. The active acoustic system of claim 1 comprising an encapsulation layer disposed on one side of the substrate.

7. The active acoustic system of claim 1 wherein the control circuit is configured to drive an AC voltage across at least one of the piezoelectric microstructures to cause the piezoelectric microstructures to produce an acoustic sound.

8. The active acoustic system of claim 7 wherein the acoustic sound is ultrasonic.

9. The active acoustic system of claim 1 wherein the control circuit is configured to receive a voltage signal from at least one of the piezoelectric microstructures to detect an acoustic sound from an acoustic source in an external environment.

10. The active acoustic system of claim 9 wherein the control circuit is configured to use beamforming techniques to detect a location of the acoustic source.

11. The active acoustic system of claim 1 wherein the substrate is flexible.

12. The active acoustic system of claim 1 wherein the substrate is rigid.

13. The active acoustic system of claim 1 wherein the substrate is formed from polyvinylidene fluoride (PVDF), a piezoelectric polymer, a piezoelectric composite, a piezoelectric ceramic, and/or a piezoelectric single-crystal material.

14. The active acoustic system of claim 1 wherein the piezoelectric substrate comprises two or more conductive traces, each coupled to one or more piezoelectric microstructures.

15. The active acoustic system of claim 14 wherein the control circuit is configured to address individual piezoelectric microstructures by activating at least two of the conductive traces.

16. The active acoustic system of claim 15 wherein the control circuit is configured to address a block of piezoelectric microstructures by activating at least two of the conductive traces.

17. An active acoustic surface comprising:
a piezoelectric substrate having an array of piezoelectric microstructures, each piezoelectric microstructure having at least one electrical terminal for coupling to a driver circuit; and
a protective layer disposed on one side of the substrate, the protective layer comprising an array of through holes, each through hole in the array of through holes positioned over a piezoelectric microstructure of the array of piezoelectric microstructures.

18. The active acoustic surface of claim 17 wherein the substrate comprises protrusions that form the piezoelectric microstructures.

19. The active acoustic surface of claim 18 wherein at least one of the protrusions is dome-shaped.

20. The active acoustic surface of claim 18 wherein at least one of the protrusions has a concave surface.

21. The active acoustic surface of claim 18 comprising an encapsulation layer disposed on one side of the substrate.

22. The active acoustic surface of claim 17 wherein at least one piezoelectric microstructure is coupled to the driver circuit, and the driver circuit is configured to drive an AC voltage across at least one of the piezoelectric microstructures to cause the piezoelectric microstructures to produce an acoustic sound and/or receive a voltage signal from the piezoelectric microstructure to representing an acoustic sound detected by the piezoelectric microstructure.

23. The active acoustic surface of claim 17 wherein the substrate is flexible.

24. The active acoustic surface of claim 17 wherein the substrate is rigid.

25. The active acoustic surface of claim 17 wherein the substrate is formed from a piezoelectric polymer, a piezoelectric composite, a piezoelectric ceramic, and/or a piezoelectric single-crystal material.

* * * * *